United States Patent [19]
Ray

[11] Patent Number: 5,831,280
[45] Date of Patent: Nov. 3, 1998

[54] DEVICE AND METHOD FOR PROGRAMMING A LOGIC LEVEL WITHIN AN INTEGRATED CIRCUIT USING MULTIPLE MASK LAYERS

[75] Inventor: S. Doug Ray, Austin, Tex.

[73] Assignee: Advanced Micro Devices, Inc.

[21] Appl. No.: 977,213

[22] Filed: Nov. 24, 1997

Related U.S. Application Data

[62] Division of Ser. No. 311,216, Sep. 23, 1994, Pat. No. 5,644,144.

[51] Int. Cl.$^6$ .................................................. H01L 23/58
[52] U.S. Cl. ............................ 257/48; 257/209; 257/435; 438/942; 438/947
[58] Field of Search ........................... 257/48, 209, 435; 430/313, 314; 438/942, 947

[56] References Cited

U.S. PATENT DOCUMENTS 5,260,597  11/1993  Orbach et al. ........................... 257/529
5,594,273   1/1997  Dasse et al. ............................. 257/620

*Primary Examiner*—Minh-Loan Tran
*Attorney, Agent, or Firm*—Kevin L. Daffer; Conley, Rose & Tayon

[57] ABSTRACT

A device and method is provided for programming an output logic level based on one or more revisions to mask layers utilized for forming an integrated circuit. The programmed logic level is represented as a logic value and is output from a device embodied within the integrated circuit formed from the mask layers. Each revision of mask layers is represented as a binary value at bit locations within a revision code output from the present system. The device and method hereof is used to program the system in accordance with an infinite numbers of mask layers and revisions to those mask layers. The programmed output from the system is represented as a revision code of numerous bits output through a pin location extending from the outer surface of a package surrounding the integrated circuit. Ready access to the pin location allows an end user to access and determine a version of integrated circuit product embodied within a sealed package, without opening the package and destroying the enclosed product.

5 Claims, 7 Drawing Sheets

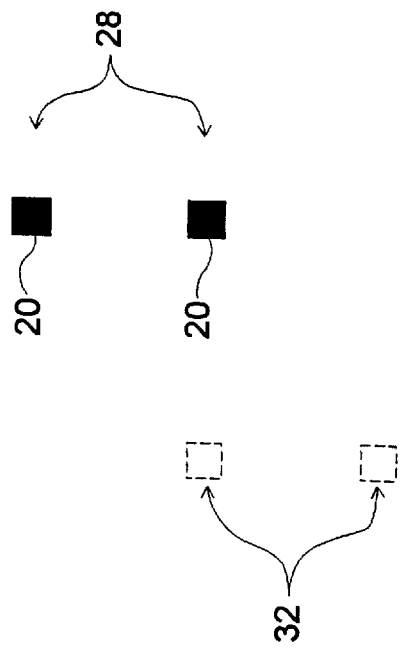
Fig. 3C
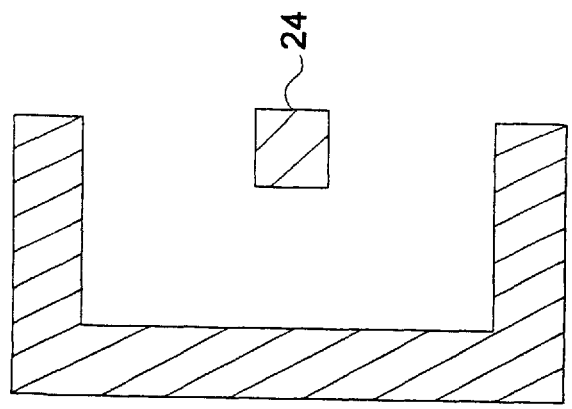
Fig. 2C

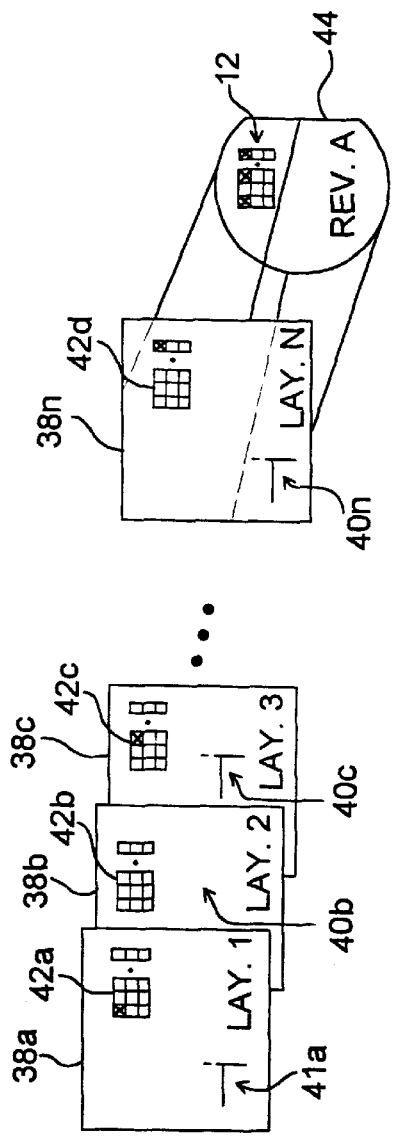
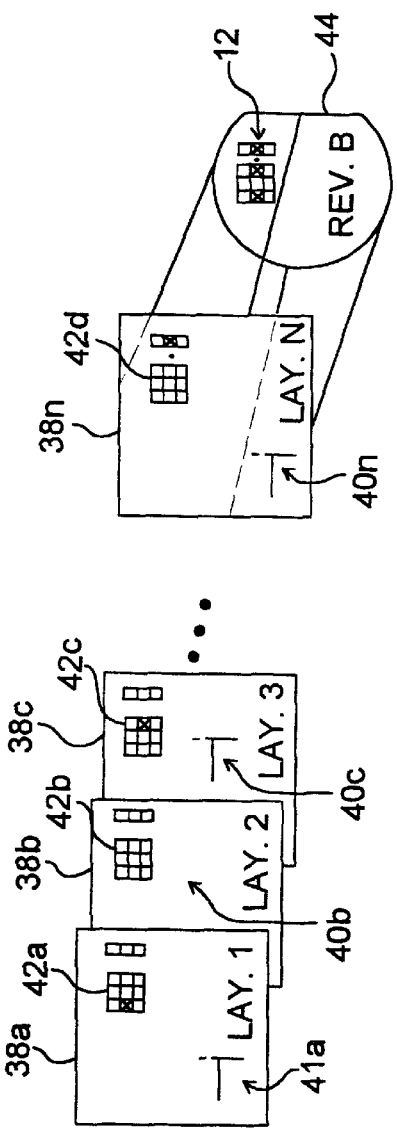

| PROG. VALUE | CI | C̄I | CO | C̄O | |
|---|---|---|---|---|---|
| 0 | 0 | 1 | 0 | 1 | ← 46 |
| 0 | 1 | 0 | 1 | 0 | ← 48 |
| 1 | 0 | 1 | 1 | 0 | ← 50 |
| 1 | 1 | 0 | 0 | 1 | ← 52 |

Fig. 8

| PROG. VALUE LAY. 1 | PROG. VALUE LAY. 2 | PROG. VALUE LAY. 3 | $CO_3$ |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

Fig. 9

| REVISION LOG ||
|---|---|
| REV. CODE | DESCRIPTION |
| 0 0 1 | REV. A |
| 0 1 0 | REV. B |
| 0 1 1 | REV. C |
| ⋮ | |
| 1 1 1 | REV. G |

Fig. 10

DEVICE AND METHOD FOR PROGRAMMING A LOGIC LEVEL WITHIN AN INTEGRATED CIRCUIT USING MULTIPLE MASK LAYERS

This is a Division of application Ser. No. 08/311,216, filed Sep. 23, 1994, now U.S. Pat. No. 5,644,144.

BACKGROUND OF THE INVENTION

1. Field of the Invention

This invention relates to an integrated circuit and more particularly to a device and method for identifying a set of masks used in manufacture of the integrated circuit.

2. Description of the Relevant Art

A mask is a well known tool for placing a patterned image onto a semiconductor substrate. A mask is capable of transferring the image to an entire wafer or to another mask in a single exposure. As defined herein below, "mask" includes the well known term "reticle". Instead of transferring an entire wafer image in a single exposure, a reticle can be used to perform the transfer in a step-and-repeat fashion. In either instance, mask transfer or reticle transfer involves in a broad context the transfer of a patterned image from the mask (defined to include a reticle) to the wafer in a series of photolithography steps.

A mask is fabricated from a glass or glass-like (i.e., quartz) starting material. Upon the glass material, a coating of chrome can be placed. The chrome is then exposed and etched at select regions to form a pattern across the mask. The pattern consists of areas of transparent and opaque regions—the opaque regions being impermeable to radiation.

In order to form an integrated circuit upon a semiconductor substrate, multiple masks are necessary. Each mask is used to pattern a layer on the substrate, and successive layers are required to achieve an integrated circuit. In CMOS integrated circuit manufacture, for example, more than ten (and sometimes more than fifteen) mask layers are needed. The pattern on each mask is transferred in proper sequence to the upper surface of the semiconductor substrate. It is therefore the mask which determines the outcome (structure and function) of the resulting integrated circuit. Any change in the pattern of one or more masks will cause a resulting change in the circuit outcome.

During the development of an integrated circuit, it is oftentimes necessary to revise one or more masks to enhance integrated circuit performance. On large area integrated circuits or circuits which are highly dense and complex in functionality, the number of mask revisions are generally numerous. For example, a microprocessor integrated circuit may undergo a dozen or more revisions, entailing possible changes to a half-dozen or more layers for each revision. Keeping track of changes to each layer and associated revision numbers for a particular integrated circuit product can be unduly burdensome. Many manufacturers indicate mask revisions by changing the designator on the mask being revised. The designator is therefore patterned onto the substrate for visual detection by the end user. The user can therefore inspect the resulting wafer and determine the specific mask revision number used. For example, a wafer which embodies the second revision to n-type well, the third revision to polysilicon, the fourth revision to first metal and the fifth revision to second metal has on its upper surface those revision numbers etched from mask for visual inspection by the manufacturer. The manufacturer can then dice the wafer and package each die in accordance with the marked revision numbers.

Oftentimes, all that distinguishes an operable low-speed device from an operable high-speed device is a revison to one or more masks layers. While a manufacturer can determine the operability of a device based on the descriptors etched on the wafer surface, customers or end-users are not so fortunate. After the manufacturer sorts product according to mask layer revision, and places die into hermetically sealed packages, the die may no longer contain the descriptors if the descriptors are placed, for example, in scribe areas or test locations on a wafer. More importantly, once die are packaged, inspection of mask layer revision requires that the package be opened so that the user can view the descriptor if the discriptors are placed on the die or on the changed (revised) circuit area. Once the package is opened, it generally cannot be re-sealed. Therefore, the die associated with that package must be discarded. Not only is visual inspection of packaged die destructive to the die (i.e., forbids re-use of the die), but it is also burdensome and time consuming. Visual inspection requires tools for opening the package as well as an optical magnification device.

Visual inspection, especially visual inspection after packaging, presents numerous problems to the end-user. If an integrated circuit is sold as having a particular application based on a set of mask layers, and that a separate application can be achieved if a revision to the mask layer is used, then it would be advantageous for an end-user to know of the various applications and mask layer revisions associated therewith. For example, it may be necessary to signify various operating speeds of a integrated circuit device via revisions to mask layers. An updated mask layer could be used to produce a speed grade of a device that was previously unavailable. Thus, device operating modes can be mask programmable at various multiple clocking speeds through enable/disable selection internal or external to the device.

If the user, for example, is unable to achieve a system outcome based upon the inadequacy of a packaged integrated circuit, the user might wish to know how that integrated circuit can be modified to achieve system adequacy. In that instance, it would be advantageous for the user to contact the integrated circuit manufacturer and explain the encountered problem. If visual inspection is the only methodology for determining mask revision of that integrated circuit, then the manufacturer has little recourse in fixing the problem on that specific integrated circuit. If the integrated circuit is inadequate for reasons of speed, the manufacturer is unable to determine if the user-purchased integrated circuit is of the higher speed variety or the lower speed variety. The manufacturer therefore, cannot recommend substituting the integrated circuit for a higher speed (different mask set revision) version.

From both the user's and manufacturer's perspective, non-destructive identification of an after-market (packaged die incorporated into the user's system) integrated circuit would be highly desirable. Capability of non-destructive, electrical read-out on a package pin-out of the mask set used for forming the integrated circuit would be advantageous. Further, read-out must accommodate an infinite number of mask layers as well as an infinite number of mask layer revisions.

SUMMARY OF THE INVENTION

The problems outlined above are in large part solved by the mask layer identification device and method of the present invention. That is, the mask identification system hereof utilizes a device embodied in a portion of an integrated circuit. The device can be assessed via a pin extending from the packaged integrated circuit. Thus, mask layer revision for the packaged circuit can be determined by electrically contacting the pin and reading device status. The device stores a unique binary code corresponding to the mask layers used in forming the integrated circuit. Like the integrated circuit, each layer of the device is programmed whenever changes are made to that mask layer. If a mask layer is changed, indicating a revision, the device pattern on that mask is also changed. Changes to the device pattern correspond to a programmed binary value stored on the integrated circuit.

An integrated circuit may embody a plurality of devices. Each device produces a programmed logic level corresponding to revisions to one or more mask layers. Devices are serially coupled to discrete bit locations in a storage register. Subsequent revisions to one or more mask layers affect the value fed to the storage register. Revision level can then be decoded from the binary value present in the storage register. The first revision can be encoded as bit pattern 01, revision two as 10, revision three as 11, etc. There may be an infinite number of bit locations indicative of an infinite number of revisions. Moreover, each device may include a infinite number of programmable circuits, coupled in series with one another. Each programmable circuit represents a layer on the integrated circuit and is formed by a distinct mask layer. As such, an infinite number of mask layers can be revised and tracked for each revision and, as stated above, an infinite number of revisions can be identified.

Broadly speaking, the present invention contemplates a device for receiving a fixed logic level at an input to the device and for producing a programmed logic level at an output of the device in accordance with a change one or more mask layer used to lithography form the device. The device is made from a first mask layer having opaque elements arranged in a pattern across the first mask layer. A portion of the opaque elements are confined within a first layer programmable cell. A second mask layer may also be used having opaque elements arranged in a pattern across the second mask layer. A portion of the second mask layer is confined within a second layer programmable cell. The opaque elements within the first and second layers, along with respective opaque elements within the first and second layer programmable cells, can be reconfigured according to normal mask layer revision techniques. A device is formed in a portion of a semiconductor substrate arranged for optically receiving the opaque elements within the first and second layer programmable cells. The device is electrically connected to receive a fixed logic level and, based upon the reconfigured opaque elements, to produce a programmed logic level.

The device hereof comprises a first layer programmable circuit and a second layer programmable circuit series connected between the fixed logic level and the programmed logic level. The first layer programmable circuit compromises conductive paths lithography formed from the first layer programmable cell. The second layer programmable circuit comprises conductive paths lithography formed from the second layer programmable cell. A logic value of the programmed logic level is dissimilar to a logic value of the fixed logic level during times in which a single layer of opaque elements within the first or second layers are reconfigured.

The device hereof may further comprise a third mask layer having opaque elements arranged in a pattern across the third mask layer. A portion of the opaque elements are confined within a third layer programmable cell. The opaque elements within the third layer along with the opaque elements within the third layer programmable cells can be reconfigured according to normal mask layer revision techniques. A logic value of the programmable logic level is dissimilar to a logic value of the fixed logic level during times in which an odd number of layers of opaque elements within the first, second and third layers are reconfigured.

The present invention further contemplates a system embodied within an integrated circuit for non-destructive readout of a mask layer revision used to produce the integrated circuit. The system comprises a plurality of devices formed in a portion of a semiconductor substrate. Each of the plurality of devices includes a plurality of series-connected programmable circuits and each programmable circuit is arranged on a distinct layer from a plurality of layers lithography formed on the semiconductor substrate. Each of the plurality of devices is connected to receive a fixed logic level and to produce a programmed logic level. A logic value of the programmed logic level is dissimilar to a logic value of the fixed logic level during times in which an odd number of the plurality of series-connected programmable circuits are reconfigured in accordance with revisions to said layers. A parallel load register is included with the system, and is coupled to receive the plurality of devices and, upon further receipt of a clocking input, to readout a revision code corresponding to a revision of the layers. The system further comprises an integrated circuit package for hermetically sealing the integrated circuit therein. The integrated circuit package includes a pin extending from the package and electrically connected to receive the revision code. The revision code comprises a binary code containing a plurality of bits. Each bit corresponds to the programmed logic of each respective device. The logic value of the fixed logic level is substantially equal to a ground potential and the programmed logic level is substantially equal to either the ground potential or a power potential. The power potential is at a voltage value exceeding the ground potential.

The present invention further contemplates a method for determining a set of mask layers used to produce an integrated circuit. The method comprises the steps of providing a plurality of mask layers, wherein each mask layer comprises opaque elements arranged in a pattern across the mask layer and a portion of the opaque elements on each mask layer is confined within a programmable cell. From the programmable cell of each mask layer, a programmable circuit is lithography formed at respective layers within an integrated circuit. The programmable circuit at one layer can be electrically connected to another programmable circuit if two or more programmable circuits are needed to form a device. A mask layer revision is formed by reconfiguring opaque elements on one of the plurality of mask layers and one of the programmable cells. By stimulating the input of the series-connected device, a programmed logic level at the output of the series-connected device is produced. The programmed logic level is programmed at a logic value based on the reconfigured opaque elements within the programmable cells. The logic value of the programmed logic level can be read from the series-connected device in accordance with a mask layer revision identifier.

BRIEF DESCRIPTION OF THE DRAWINGS

Other objects and advantages of the invention will become apparent upon reading the following detailed description and upon reference to the accompanying drawings in which:

FIG. 2c is a top layout view of changes to (or reconfiguration of) the unprogrammed and programmed state of FIGS. 2a and 2b;

FIG. 3c is a top layout view of the changes to (or reconfiguration of) the unprogrammed and programmed states of FIGS. 3a And 3b;

FIGS. 5–7 illustrate mask layer revisions at select mask layers and the resulting binary order revisions at respective programmable cell locations according to the present inventions;

FIG. 8 is a truth table of a programmable circuit function showing exclusive-or logic according to the present invention;

FIG. 9 is a truth table of the device function having exemplary three layers of programmable circuits according to the presents invention; and FIG. 10 is a revision log look-up table illustrating a revision code readout from a plurality of devices having exemplary three bit number locations with the revision description applying to each revision code.

Figure 1:
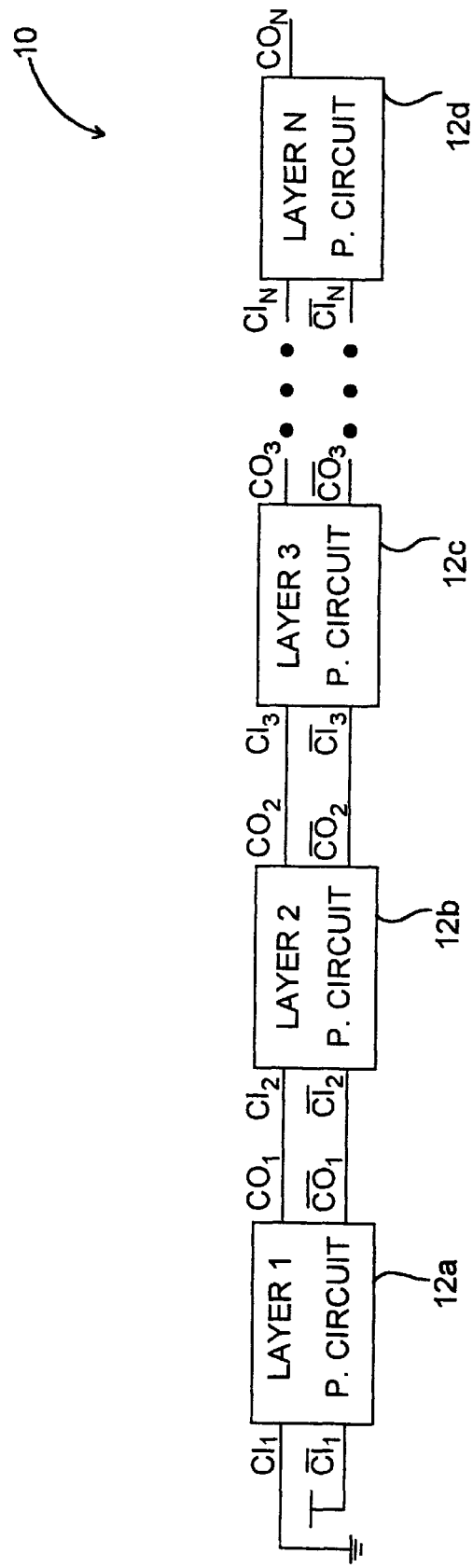
FIG. 1 is a block diagram of a device for programming a logic revel according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a device 10 of the present invention is shown. Device 10 includes an n-number of series-connected programmable circuits 12. Each programmable circuit 12 is formed on a distinct layer of a semiconductor substrate. Programmable circuit 12a is therefore formed on a separate layer from programmable circuit 12b, programmable circuit 12c and programmable circuit 12d. As shown, programmable circuits 12 can accommodate any number of layers used in forming an integrated circuit. The integrated circuit can therefore be of any fabrication technology, including MOS (NMOS and CMOS) as well as bipolar, ECL, on silicon substrate or GaAs. Each programmable circuit 12 is coupled to receive an input (carry-in) CI and CI bar. Depending upon how the programmable circuit 12 is configured (i.e., "programmed"), the respective programmable circuit produces various logic levels at the output nodes (carry-out) denoted CO and CO bar. The programmable circuits are connected in series, such that CO and CO bar is connected to CI and CI bar as shown. The output of first layer programmable circuit 12a is coupled to the input of second layer programmable circuit 12b, and the output of second layer programmable circuit 12b is connected to the input of third-layer programmable circuit 12c. The input to the first layer programmable circuit 12a is fixed, wherein $CI_1$ is connected to ground and $CI_1$ bar is connected to VDD. Given the fixed logic level at the input to first layer programmable circuit 12a, and given the series connection from programmable circuit 12a to nth layer programmable circuit 12d, the output of nth layer programmable circuit 12d is placed at a programmed logic level $CO_N$.

Figure 2B:
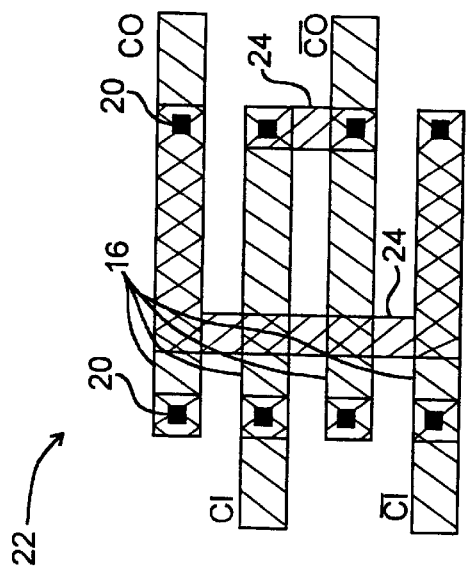
FIG. 2b is a top layout view of the first layer programmable circuit shown in a programmed state according to the present invention.
Figure 2A:
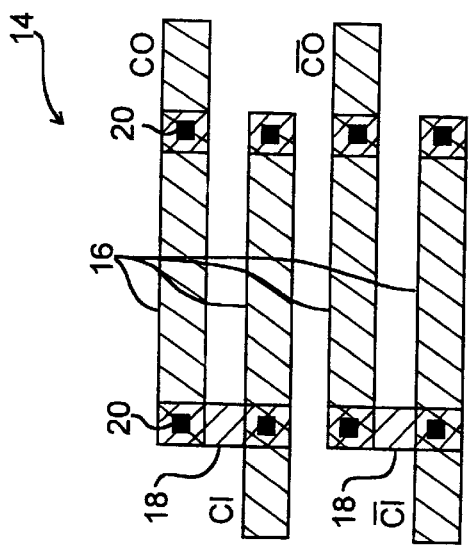
FIG. 2a is a top layout view of a first layer programmable circuit shown in an unprogrammed state according to the present invention.

Referring now to FIGS. 2a–2c, a top layout view of a programmable circuit, either programmable circuit 12a, 12b, 12c or 12d, is shown. FIG. 2a illustrates an "unprogrammed" programmable circuit 14. Circuit 14 contains conductive paths 16 extending between CI to CO, and from CI bar to CO bar, conductive paths 16 are connected by conductive jumpers 18 placed at unprogrammed sites of circuit 14. Jumpers 18, as well as areas immediately surrounding contacts 20, are on separate layers from conductors 16. Distinction between the layers is illustrated by positive 45° cross-hatching for conductors 16 and negative 45° cross-hatching for jumpers 18. As noted, jumpers 18 and conductors 16 are spaced apart and reside one over the other in regions immediately surrounding contacts 20.

FIG. 2b illustrates a programmed programmable circuit 22. Instead of jumpers placed at the sites shown in FIG. 2a, jumpers 24 of FIG. 2b are placed as shown to bring about electrical connection between CI and CO bar and between CI bar and CO. Jumpers 24 extends in a C-shaped segment and a straight segment underneath (or over) conductors 16 and connect at contact regions 20. As shown in FIG. 2c, program configuration of programmable circuit 12 is achieved by deleting conductors from jumpers locations 18 and forming conductors at jumpers locations 24. It is appreciated from the drawings of FIGS. 2a–2c that programmability of programmable circuit 12 is carried forth by reconfiguration of conductive elements on a single layer, i.e., the layer denoted with negative 45° cross-hatching. Since programmability is achieved on a single layer, the programmable circuit is confined within one region (either first layer programmable circuit region 12a, second layer programmable circuit region 12b, third layer programmable circuit 12c or nth layer programmable circuit 12d. Each programmable circuit 12a–12d can be programmed according to the reconfiguration techniques shown in FIGS. 2a–2c to bring about programmability on a single layer for each programmable circuit 12a, 12b, 12c or 12d.

Figure 3B:
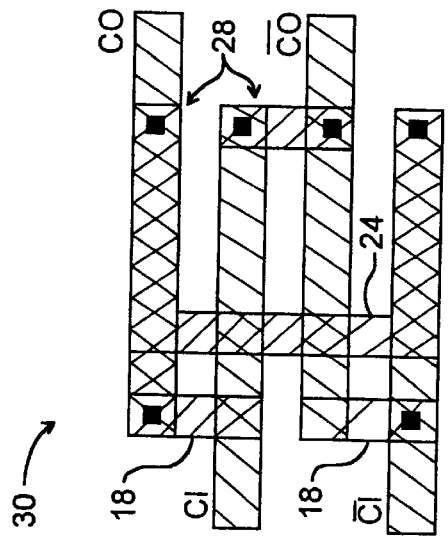
FIG. 3b is a top layout view of the second layer programmable circuit shown in a programmed state according to the present invention.
Figure 3A:
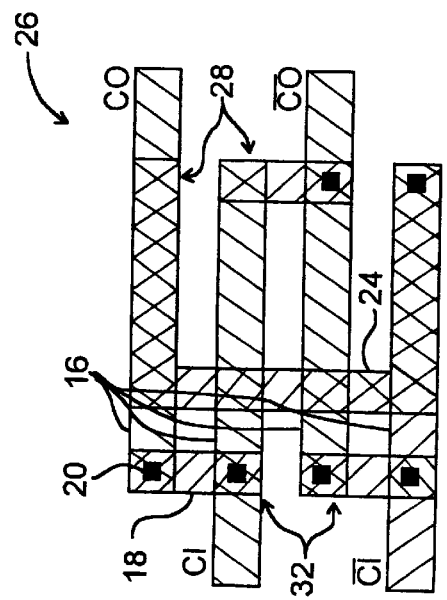
FIG. 3a is a top layout view of a second layer programmable circuit shown in an unprogrammed state according the present invention.

Turning now to FIGS. 3a–3c, layer programmability can be achieved in a perpendicular orientation to the upper surface of the substrate topography. Instead of reconfiguration taking place on conductive layers extending parallel to the upper topography as shown in FIGS. 2a–2c, programmability can be performed by reconfiguration of conductive layers extending perpendicular to the upper topography by the presence or absence of contact regions (as shown in FIGS. 3a–3c.) Thus, "layer" programmability is defined herein below as any conductive layer extending substantially parallel or perpendicular to the substrate surface, and includes any conductive region which can be altered to bring about retracing or altered connectivity between inputs CI and CI bar to outputs CO and CO bar.

FIG. 3a illustrates a top layout view of an unprogrammed programmable circuit 26. Like circuits 14 and 22 shown in FIGS. 2a and 2b, respectively, circuit 26 includes conductors 16, as well as jumpers 18 and 24. Circuit 26 also includes contacts 20 arranged between most but not all overlap regions between conductive elements. Contacts 20 are absent from overlap regions 28 in order to ensure an unprogrammed state of connection between input CI and output CO and between input CI bar and output CO bar.

FIG. 3b illustrates a programmed programmable circuit 30. Circuit 30 is identical to circuit 26, except for a change in locations of contacts from region 32 of FIG. 3a to region 28 of FIG. 3b. Movement of contacts from regions 32 to regions 28 is more clearly shown in FIG. 3c, and is used to achieve programmability of circuit 30. Absence of contacts at locations 32 and presence of contacts 20 at regions 28 provides electrical connection between input CI to output CO bar and connections between input CI bar to output CO.

It is appreciated from the foregoing description of FIGS. 2a–3c, that "program" of programmable circuits 12a–12c is brought about by reconfiguration of conductive layers from one site to another site. In addition, reconfiguration of circuits 12a–12d allows inverse connection of input terminals to output terminals from that of the unprogrammed state. Still further, program of each programmable circuit can be achieved by modification of only a single mask layer used to form the conductive elements. Therefore, any change or revision to a mask layer can also be included as a change or revision to a programmable cell within that masks, used to form a corresponding programmable circuit 12 on the integrated circuit substrate. Revisions to a single mask or a plurality of masks used to form a unique version of a ensuing integrated circuit product can be identified by a change in logic between the input and output terminals of corresponding programmable circuits 12a–12d.

Figure 4:
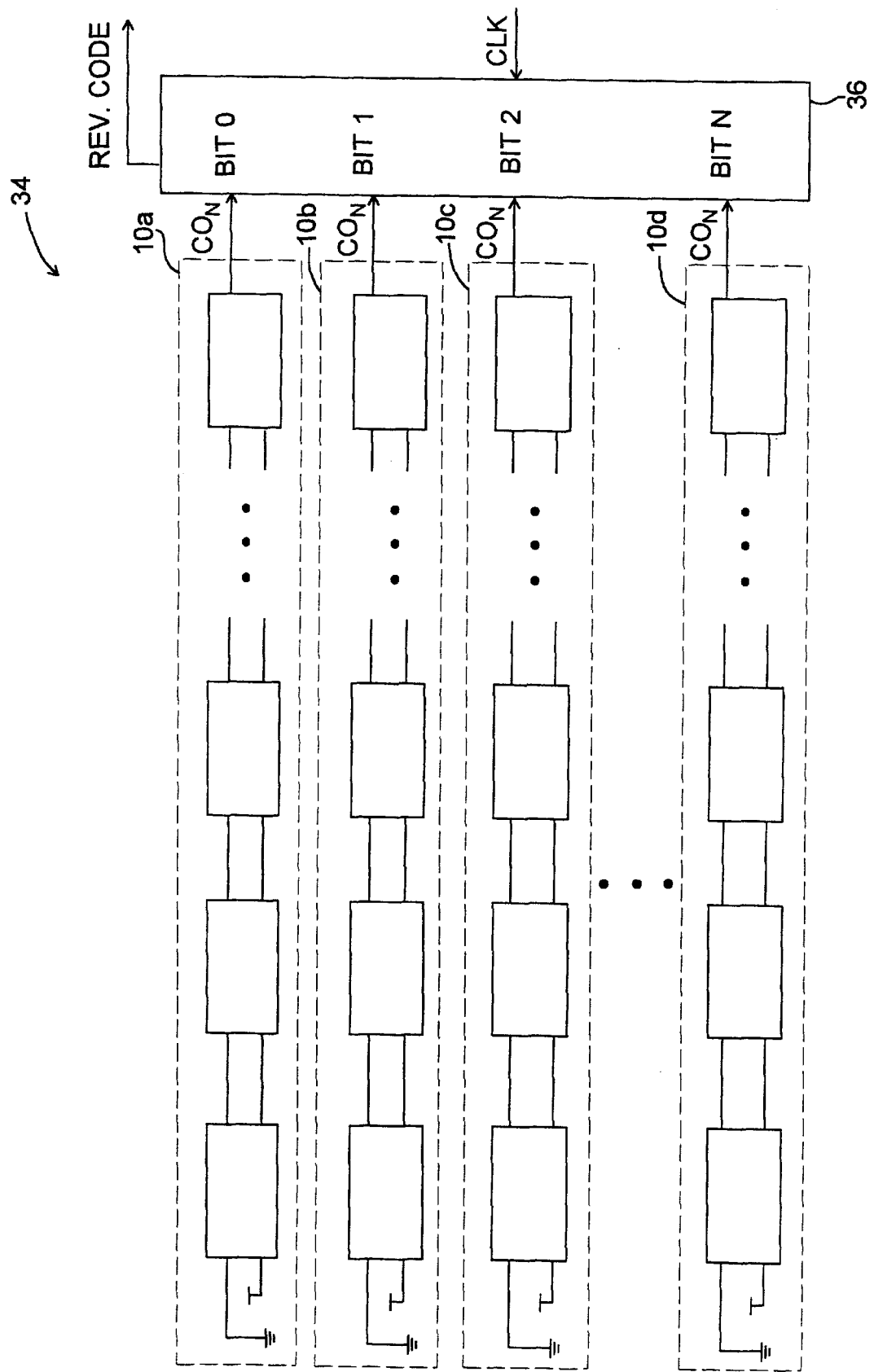
FIG. 4 is a block diagram of a plurality of devices of FIG. 1, connected is parallel to a storage device having serial readout capability according to the present invention.

Illustrated in FIG. 4 is a system 34 used for keeping track of mask layer revisions and for non-destructive readout of those revisions. Each set of mask layer revisions used to produce a unique product is identified by a unique revision code (REV. CODE) output from system 34. System 34 includes a plurality of devices 10 connected in parallel to a storage device 36. A suitable storage device 36 includes a parallel load register. As shown, each device 10 includes series-connected programmable circuits 12, wherein the first layer programmable circuit is connected to a fixed logic level and the last layer programmable circuit is adapted for outputting a programmable logic level $CO_N$. Programmable logic $CO_N$ is represented as a logic value of "1" or "0". A logic value 1 is at a higher voltage magnitude than logic value 0, and preferably logic value 1 is at or near power potential of VDD, while logic value 0 is at or near ground potential.

According to a preferred embodiment, the first revision of mask layers used to achieve a first version of integrated circuit product is carried forward entirely within the programmable circuits of device 10a and is represented at programmed logic level $CO_N$ of bit 0. The second revision is carried forward entirely within the programmable circuits of device 10b and represented as programmed logic level $CO_N$ of bit 1. The third revision of mask layers is carried forward entirely within programmed circuits of devices $10_a$ and $10_b$, and is represented on bits 0 and 1. The fourth mask layer revision is carried forward entirely within the programmed circuits of device 10c and is represented as bit 2.

Indicative of the pattern described immediately herein above, each revision of mask layers is designated as a binary number, and subsequent revisions are given subsequent binary numbers exceeding the last binary number. Thus, the first revision is represented as a 0001 revision code, the next revision as 0010, the third revision as 0011, the is fourth revision as 0100, and so on. The binary count of revision code output (REV. CODE) from storage device 36 is therefore representative of the specific revision of mask layers used to produce the integrated circuit embodying devices 10a–10d. It is appreciated from the drawing of FIG. 4 that there can be numerous (infinite) layers of programmable circuits for each device 10 and that there can be numerous (infinite) number of devices. Storage device 36 is adapted to receive a unique logic value for each bit location representative of the unprogrammed or programmed status of program circuits within each device 10, and that the bit locations can be parallel loaded into device 36 and read therefrom as a revision code of binary logic values. Reading from storage location 36 as performed by a clocking input (CLK), occurs during a clocking cycle of CLK.

Figure 7:
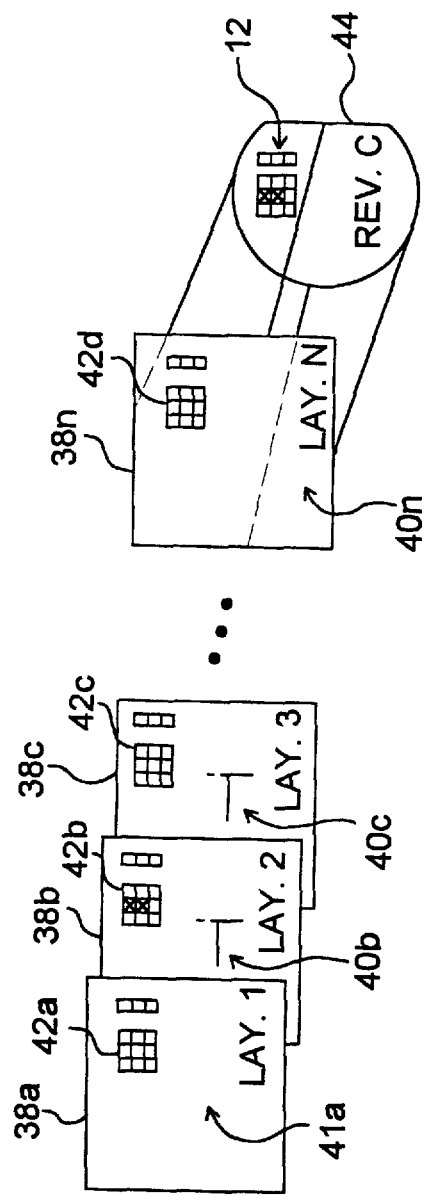

As shown in FIGS. 5–7, in conjunction with FIG. 4, revisions to mask layers 38 are reflective of changes to specific locations of programmed circuits 12 of FIG. 4 to achieve a programmed status logic level $CO_N$ for each mask set revisions. Changes occur by reconfiguring opaque elements necessary to achieve binary order revisions at bit locations 0 through n.

Referring now to FIG. 5, a first revision of mask layers necessary to produce a version of integrated circuit product denoted as "Rev. A" is shown. The first revision is performed on mask layers 38a, 38c and 38n (mask layers 1,3 and n), while all other layers are unchanged. Revisions to opaque elements are shown on mask layers 38a, 38c and 38n by change shown to those elements at locations 40a, 40c and 40n. The pattern on mask layer 38b is not changed at any location of 40b, and therefore, the second layer programmable cell 42b is not changed. However, since layers 1, 3 and n are changed at locations 40a, 40c and 40n, first layer programmable cell 42a, third layer programmable cell 42c and nth layer programmable cell 42d are changed at specific locations denoted as having an "X". Changes to mask layers and specifically changes to locations within programmable cells 42a–42d are reflected on the integrated circuit of wafer 44 at specific locations within programmable circuits 12 embodied therein. The programmed circuits 12 are shown on wafer 44 as having an "X" placed at specific locations indicative of specific mask layer changes. Programmed programmable circuit 12 is shown to produce unique wafer 44 designated as "Rev. A", wherein the wafer modification/program is at a location specific to bit 0 locations within device 10a. Bit 0 indicates a programmed logic level representative of the specific revision to mask layers 1, 3 and N, shown in FIG. 5. The remaining devices 10b–10d are not changed, and are reserved for subsequent revisions, such as those shown in FIGS. 6 and 7.

Referring now to FIG. 6, a second revision denoted as "Rev. B", possibly subsequent to Rev. A is shown. Specifically, FIG. 6 illustrates revisions to the first mask layer at locations 40a, revisions to the third mask layer-at locations 40c, and revisions to the nth layer at locations 40n. The revisions are also reflected in the programmable cell locations to 42a, 42c and 42d. It is appreciated from the drawings of FIGS. 5 and 6 that while the same mask layers can be changed, a different revision code will result since the revisions are reflected at different binary locations (i.e., bit 0 versus bit 1). Changes at specific locations, dissimilar from through locations of FIG. 5 produce modification to wafer 44, and specifically to programmable circuit 12 as denoted by the "X" designator of FIG. 6. The "X" designator of FIG. 6 is at bit 1 location output of device 10b, rather than at bit 0 location of device 10a. The bit 1 location indicates the second revision using conventional bit code counting. The second bit location, like the first bit location, receives a logic value of one or zero indicating a odd number of mask layers being programmed. More particularly, a zero logic level indicates program of an even number of programmable circuits 12 or no program (change) of any programmable circuit 12 within device 10. Since three programmable circuits 12 are changed within Rev. A and Rev. B, a logic 1 will appear as input to bit 0 and bit 1 locations respectively. As appreciated from a comparison of FIGS. 5 and 6, even though the same layers are changed in a subsequent revision, a dissimilar and distinct binary code is read as a revision code from storage location 36.

Referring now to FIG. 7, a third revision is shown on second layer mask 38b. The revision at site 40b is reflected as a revision to programmable cell 42b. Changes to programmable cell 42b are patterned on wafer 44 at programmable circuit 12. Specifically, changes to programmable circuit 12 of FIG. 7, indicative of third revision (Rev. C) are placed at binary locations bit 0 and bit 1 to indicate a third revision measured in binary. Thus, FIGS. 5–7 illustrate an identification scheme for representing each set of mask layers and the revisions to those mask layers as a unique binary code, wherein each set of mask layer revisions represents a dissimilar yet unique binary code (denoted as revision code).

Referring now to FIG. 8, a truth table of programmable circuit 12 functionality is shown. If a programmable circuit is unprogrammed and similar to the embodiments shown in FIGS. 2a and 3a, then CI and CI bar will be passed through to CO and CO bar, respectively, as shown by lines 46 and 48 of FIG. 8. If programmable circuit 12 is programmed, similar to the embodiments shown in FIGS. 2b and 3b, then CI and CI bar will be inverse connected to outputs CO bar and CO, respectively, as shown by lines 50 and 52 of FIG. 8.

Referring now to FIG. 9, a truth table of device 10 functionality is shown. Layer 1 programmable circuit 12a, layer 2 programmable circuit 12b, and layer 3 programmable circuit 3c are programmed to a "1" value as shown. If circuits 12a, 12b and 12c are not programmed, or unprogrammed, then a "0" value is shown. In the exemplary embodiment of FIG. 9, three series-connected programmable circuits are used; however, it is understood that less than three and more than three programmable circuits can be series connected with one another, as shown in FIGS. 1 and 4. For simplicity purposes only, FIG. 9 illustrates the logic value of only three programmed logic levels with a cumulative programmed logic level, $CO_3$. Specifically, the programmed values for each layer are exclusive-or with one another to produce a logic value output. Similar to the exclusive-or function of FIG. 9, FIG. 8 programmed value is exclusive-ored with an input value to produce and respective output value. The exclusive-or function allows changes to one or more mask layers to be reduced to a single logic value.

It is important to understand that a programmed output is one which indicates a "1" logic value at $CO_N$. If none of the mask layers are changed, then the logic value remains at a logic "0" level. However, if one mask layer is changed, then the output of that mask layer will be exclusive-ored with the non-changed outputs of the other layers to present a logic high value at $CO_N$. If two, or an even numbers of masks are changed, then an additional non-changed (mask) within the programmable cell 42 must be modified in order to produce a logic high value for the programmed logic $CO_N$. If a logic high value is not encountered at the programmed logic level,
then the user or manufacturer cannot ascertain a program state for that unique revision, and must assume that no mask layers have been revised. Thus, if an even number of masks are revised, then one more masks (unchanged mask in the programmed cell area) must be changed to produce the necessary programmed output high value. If an odd number of masks are changed for a given set of masks, then no additional masks at the programmed cell locations need to be changed in order to produce a programmed output. Accordingly, any change or revision to one or more mask layers can be easily and readily confined to a single logic value at the programmed logic level $CO_N$.

Referring now to FIG. 10, revision code taken from storage device 36 of FIG. 4 is shown to be easily and readily identified with a unique revision for each unique binary code representation. In particular, the first revision is represented as a binary one value (i.e., 001). The second revision is represented as a binary two value (i.e., 010). Further, revisions take on subsequent binary values, and each binary value corresponds to an engineering log revision or description of that particular revision. It is important to know that the revision code shown in FIG. 10 is merely exemplary of three binary logic values, and that certainly more than three or less than three can be used.

If a user has need for determining a specific version of product used in his or her system, they can easily and quickly read the revision code from a pin location connected to the operative storage device 36. By clocking storage device 36 and reading the appropriate revision code, a binary value is displayed. The user can contact the manufacturer with the revision code and the manufacturer can look up the revision code in a Revision Log similar to that shown in FIG. 9 to determine a specific revision for the user-embodied part. If the revision code indicates mask set Rev. B, and Rev. B is merely a slower speed device than that of Rev. C, then the manufacturer can exchange the Rev. B part from the user and provide the user a Rev. C part to solve any speed path problems the user is currently encountering.

It will be appreciated to those skilled in the art having the benefit of this disclosure that this invention is believed to be capable of applications with numerous types of integrated circuits embodied within an integrated circuit package. The revision code can be readily accessed without opening the package, and the revision code can be correlated to a description log of the particular product placed within that package. Furthermore, it is also be understood that the form of the invention shown and described to be taken as presently preferred embodiments. Various modifications and changes may be made to each and every lithography step utilizing the mask layers described herein above. All as would be obvious to a person skilled in the art having the benefit of this disclosure. It is intended that the following claims be interpreted to embrace all such modifications and change and, accordingly, the specification and drawings are to be regarded in an illustrative rather than a restrictive sense.

What is claimed is:

1. A method for determining a mask layer revision used to produce an integrated circuit, said method comprising the steps of:

providing a plurality of mask layers, each mask layer comprises opaque elements arranged in a pattern across said mask layer and a portion of said opaque elements on each mask layer are confined within a programmable cell;

lithography forming from the programmable cell of each said mask layer a programmable circuit at respective layers within an integrated circuit;

electrically connecting said programmable circuit at one layer to another programmable circuit at another layer to form a series-connected device;

forming a mask layer revision by reconfiguring opaque elements on one of said plurality of mask layers and one said programmable cell;

stimulating the input of said series-connected device and, based on reconfigured said opaque elements, producing a programmed logic level at the output of said series-connected device; and reading a logic value of said programmed logic level corresponding to said mask layer revision.

2. The method as recited in claim 1, wherein said lithography forming step comprises exposing an integrated circuit to one of said plurality of mask layers containing one said programmable cell and thereafter exposing said integrated circuit to other of said plurality of mask layers containing respective other said programmable cells.

3. The method as recited in claim 1, wherein said electrically connecting step comprises lithography forming a conductor during the step of lithography forming of said programmable circuit.

4. The method as recited in claim 1, wherein said stimulating step comprises applying a voltage magnitude at a fixed logic value.

5. The method as recited in claim 1, wherein said reading step comprises outputting said logic value of said programmed logic level stored within a register embodied upon said integrated circuit.

* * * * *